United States Patent
Gandikota et al.

(10) Patent No.: US 12,467,133 B2
(45) Date of Patent: Nov. 11, 2025

(54) CONFORMAL MOLYBDENUM DEPOSITION

(71) Applicant: Applied Materials, Inc., Santa Clara, CA (US)

(72) Inventors: Srinivas Gandikota, Santa Clara, CA (US); Tuerxun Ailihumaer, Santa Clara, CA (US); Yixiong Yang, Fremont, CA (US); Seshadri Ganguli, Sunnyvale, CA (US); Yogesh Sharma, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 18/222,589

(22) Filed: Jul. 17, 2023

(65) Prior Publication Data
US 2024/0026529 A1    Jan. 25, 2024

Related U.S. Application Data

(60) Provisional application No. 63/390,679, filed on Jul. 20, 2022.

(51) Int. Cl.
| | | |
|---|---|---|
| *C23C 16/04* | (2006.01) | |
| *C23C 16/02* | (2006.01) | |
| *C23C 16/08* | (2006.01) | |

(52) U.S. Cl.
CPC .......... *C23C 16/08* (2013.01); *C23C 16/0272* (2013.01); *C23C 16/045* (2013.01)

(58) Field of Classification Search
CPC .............. C23C 16/0272; C23C 16/045; C23C 16/14; C23C 16/24; C23C 16/08
See application file for complete search history.

(56) References Cited

U.S. PATENT DOCUMENTS

| | | |
|---|---|---|
| 9,583,389 B2 | 2/2017 | Romero et al. |
| 10,777,453 B2 | 9/2020 | Thombare et al. |
| (Continued) | | |

FOREIGN PATENT DOCUMENTS

| | | | | |
|---|---|---|---|---|
| DE | 102019121152 A1 | * | 2/2021 | ............ H01L 21/28 |
| JP | 2016098406 A1 | | 5/2016 | |
| | (Continued) | | | |

OTHER PUBLICATIONS

Zubarev, E.N., et al., "Growth and crystallization of molybdenum layers on amorphous silicon". Thin Solid Films, 520 (2011) 314-319.*

Farid, Nazar, et al., "Femtosecond Laser-Induced Crystallization of Amorphous Silicon Thin Films under a Thin Molybdenum Layer". Applied Materials & Interfaces, 2021, 13, 37797-37808.*

(Continued)

*Primary Examiner* — Bret P Chen
(74) *Attorney, Agent, or Firm* — SERVILLA WHITNEY LL

(57) ABSTRACT

Conformally deposited molybdenum films having reduced resistivity and methods of forming the same are disclosed. The methods include converting an amorphous silicon layer to a metal layer by thermally soaking the amorphous silicon layer comprising silicon atoms in the presence of a metal compound selected from the group consisting of a molybdenum compound and a tungsten compound until at least a portion of the silicon atoms in the amorphous silicon layer are replaced by metal atoms selected from the group consisting of molybdenum atoms and tungsten atoms. The methods include conformally depositing a molybdenum film on the metal layer.

20 Claims, 3 Drawing Sheets

(56) References Cited

U.S. PATENT DOCUMENTS

| | | | |
|---|---|---|---|
| 10,930,493 | B2 | 2/2021 | Roy et al. |
| 2017/0342553 | A1 | 11/2017 | Yu et al. |
| 2018/0247821 | A1* | 8/2018 | Chen ................ H01L 21/02592 |
| 2019/0027362 | A1* | 1/2019 | Cheng ............... H01L 21/02499 |
| 2019/0067003 | A1* | 2/2019 | Zope ................ H01L 21/32051 |
| 2019/0067006 | A1 | 2/2019 | Hawrylchak et al. |
| 2020/0105519 | A1 | 4/2020 | In et al. |
| 2020/0135456 | A1 | 4/2020 | Roy et al. |
| 2020/0243341 | A1* | 7/2020 | Wu .................... H01L 21/76876 |
| 2020/0303250 | A1 | 9/2020 | Cen et al. |
| 2020/0365456 | A1 | 11/2020 | Thombare et al. |
| 2022/0181201 | A1* | 6/2022 | Xu .................... H01L 21/28562 |
| 2022/0271130 | A1 | 8/2022 | Su et al. |
| 2023/0323543 | A1* | 10/2023 | Ailihumaer ....... C23C 16/45525 |

FOREIGN PATENT DOCUMENTS

| | | | |
|---|---|---|---|
| KR | 20210048573 | A | 5/2021 |
| WO | 2021046058 | A1 | 3/2021 |
| WO | 2021076636 | A1 | 4/2021 |
| WO | 2021239596 | A1 | 12/2021 |

OTHER PUBLICATIONS

Yoon, Soo Young, et al., "Metal-induced crystallization of amorphous silicon". Thin Solid Films 383 (2001) 34-38.*

Zamchiy, A.O., et al., "Kinetics of gold-induced layer exchange crystallization of amorphous silicon suboxide films: Experimental and theoretical study". Journal of Alloys and Compounds, 919 (2023) 168818, pp. 1-9.*

Westerik, P.J., et al., "Sidewall patterning—a new wafer-scale method for accurate patterning of vertical silicon structures". J. Micromech. Micoeng, 28 (2018) 015008, pp. 1-13.*

Heyne, Markus H., et al., "The conversion mechanism of amorphous silicon to stoichiometric WS2". Journal of Materials Chemistry C 2018, 6,4122-4130.*

"Production of Beta-Tungsten as a Function of Sputtering Pressure", Department of Materials Science and Engineering, Sibley School of Mechanical and Aerospace Engineering; Cornell University. 2018-2019 Research Accomplishments https://baker.mse.cornell.edu/.

"U.S. Appl. No. 17/714,513, filed Apr. 6, 2022, 31 pages".

Martinez, G. , et al., "Microstructure, mechanical and electrical properties of nanocrystalline W-Mo thin films", AIP Advances 7, 125201 (2017); https://doi.org/10.1063/1.5009008.

PCT International Search Report and Written Opinion in PCT/US2023/028026 mailed Nov. 20, 2023, 10 pages.

* cited by examiner

CONFORMAL MOLYBDENUM DEPOSITION

CROSS-REFERENCE TO RELATED APPLICATIONS

This application claims priority to U.S. Provisional Application No. 63/390,679, filed Jul. 20, 2022, the entire disclosure of which is hereby incorporated by reference herein.

TECHNICAL FIELD

Embodiments of the present disclosure pertain to metal film deposition. More particularly, embodiments of the disclosure are directed to conformal molybdenum deposition.

BACKGROUND

As circuit integration increases, there is an enhanced need for greater uniformity and process control regarding layer thickness. As a result, various technologies have been developed to deposit layers on substrates in a cost-effective manner, while maintaining control over the characteristics of the layer. Chemical vapor deposition (CVD) is one of the most common deposition processes employed for depositing layers on a substrate.

A variant of CVD that demonstrates excellent step coverage is cyclical deposition or atomic layer deposition (ALD). ALD employs chemisorption techniques to deliver precursor molecules on a substrate surface in sequential cycles. The cycle exposes the substrate surface top to a first precursor, a purge gas, a second precursor, and the purge gas. The first and second precursors react to form a product compound as a film on the substrate surface. The cycle is repeated to form the layer to a desired thickness. The advancing complexity of advanced microelectronic devices is placing stringent demands on currently used deposition techniques. Molybdenum and molybdenum-based films have attractive material and conductive properties. These films have been proposed and tested for applications from front end to back end parts of semiconductor and microelectronic devices. For example, in both blanket films and in gap fill applications, a liner film (e.g., a TiN liner film) is deposited to achieve low resistivity molybdenum deposition. In gap fill applications TiN is deposited in the gap to achieve both low resistivity and conformal deposition. Conformal deposition is often required in order to uniformly deposit a metal film over three-dimensional structures including high aspect ratio features.

There is an ongoing need for improved metal liners or metal layers to provide lower resistivity of molybdenum films. Accordingly, there is a need for improved materials and methods for depositing liner films to provide conformal molybdenum deposition having improved film properties.

SUMMARY

One or more embodiments of the disclosure are directed to a deposition method comprising forming an amorphous silicon layer directly on a dielectric layer on a surface of a substrate; converting the amorphous silicon layer to a metal layer by thermally soaking the amorphous silicon layer comprising silicon atoms in the presence of a metal compound selected from the group consisting of a molybdenum compound and a tungsten compound until at least a portion of the silicon atoms in the amorphous silicon layer are replaced by metal atoms selected from the group consisting of molybdenum atoms and tungsten atoms to form a metal layer having a thickness in a range of from 10 Angstroms to 50 Angstroms; and conformally depositing a molybdenum film on the metal layer.

Additional embodiments of the disclosure are directed to a method of filling a feature formed on a surface of a substrate. The method of filling the feature formed on the surface of the substrate comprises forming an amorphous silicon layer directly on a dielectric region within the feature on the top surface of the substrate. The feature comprises at least one surface defining a via, the via comprising a bottom surface and two sidewalls comprising the dielectric. The method further comprises converting the amorphous silicon layer to a metal layer by thermally soaking the amorphous silicon layer comprising silicon atoms in the presence of a metal compound selected from the group consisting of a molybdenum compound and a tungsten compound until at least a portion of the silicon atoms in the amorphous silicon layer are replaced by metal atoms selected from the group consisting of molybdenum atoms and tungsten atoms to form a metal layer having a thickness in a range of from 10 Angstroms to 50 Angstroms. The method comprises conformally depositing a molybdenum film on the metal layer to fill the feature. The conformally deposited molybdenum film substantially free of seams or voids.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
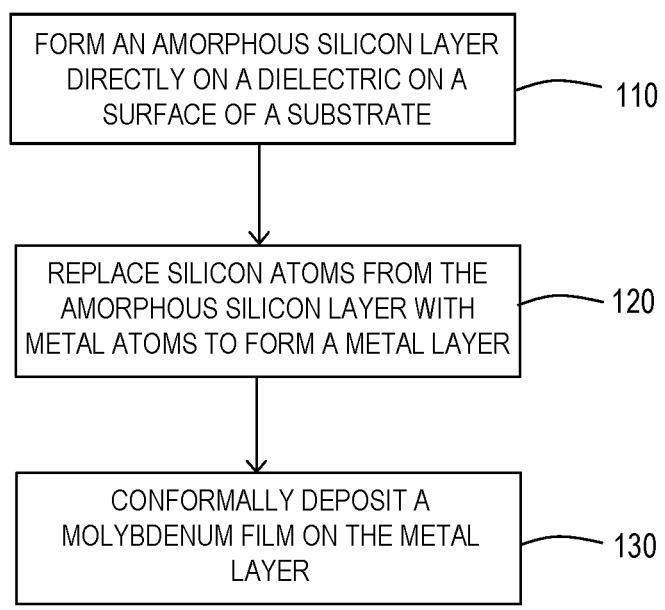
FIG. 1 illustrates a process flow diagram of a deposition method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top, two sidewalls and a bottom, peaks which have a top and two sidewalls extending upward from a surface, and vias which have sidewalls extending down from a surface with an open bottom.

As used in this specification and the appended claims, the term "selectively" refers to process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure advantageously provide methods which greatly improve blanket molybdenum film resistivity deposited on an underlying tungsten or molybdenum layer formed by the methods described in this disclosure. One or more embodiments provides methods in which a continuous thermal process is utilized to replace silicon from an amorphous silicon layer on a dielectric to form a metal layer comprising metal or tungsten. In one or more embodiments, the continuous process is performed for a period of time to form the metal layer having a predetermined process without repeating the thermal soak process used to form the metal layer. In one of more embodiments, the metal layer formed on the dielectric by replacement of the amorphous silicon has a thickness in range of 10 Angstroms to 50 Angstroms, 15 Angstroms to 50 Angstroms, 20 Angstroms to 50 Angstroms, 25 Angstroms to 50 Angstroms, 30 Angstroms to 50 Angstroms, 35 Angstroms to 50 Angstroms or 40 Angstroms to 50 Angstroms. While not wishing to be bound by any particular theory or principle, it is believed a continuous process that is not repeated results in improvements in reduction of the stack resistivity of a molybdenum film formed on the metal layer. Further embodiments advantageously provide methods of reducing the stack resistivity of bottom-up gap fill for vias with improved molybdenum film properties.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 depicts a process flow diagram of a deposition method 100 in accordance with one or more embodiments of the present disclosure. The deposition method 100, at operation 110, comprises forming an amorphous silicon layer directly on a dielectric surface, for example, on a dielectric layer on a substrate, a dielectric region of a substrate. The deposition method 100 comprises, at operation 120, converting the amorphous silicon layer to a metal layer by thermally soaking the amorphous silicon layer comprising silicon atoms in the presence of a metal compound selected from the group consisting of a molybdenum compound and a tungsten compound until at least a portion of the silicon atoms in the amorphous silicon layer are replaced by one or more metal atoms present during the process of thermally soaking the amorphous silicon layer. At operation 130, the deposition method 100 comprises conformally depositing a molybdenum film on the metal layer.

The substrate 202 can be any suitable substrate material. In one or more embodiments, the substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the substrate 400 comprises one or more of silicon (Si), germanium (Ge), gallium (Ga), arsenic (As), indium (In), phosphorus (P), or selenium (Se). Although a few examples of materials from which the substrate 202 may be made have been provided, any material that may serve as a foundation upon which passive and active electronic devices (e.g., transistors, memories, capacitors, inductors, resistors, switches, integrated circuits, amplifiers, optoelectronic devices, or any other electronic devices) may can be utilized.

In some embodiments, the substrate may include dielectric materials, for example to silicon containing dielectric materials and metal oxide dielectric materials. In some embodiments, the substrate may comprise one or more dielectric surfaces comprising a silicon containing dielectric material such as, but not limited to, silicon dioxide ($SiO_2$), silicon sub-oxides, silicon nitride ($Si_3N_4$), silicon oxynitride (SiON), silicon oxycarbide (SiOC), silicon oxycarbide nitride (SiOCN), silicon carbon nitride (SiCN). In some embodiments, the substrate may comprise one or more dielectric surfaces comprising a metal oxide such as, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), hafnium silicate ($HfSiO_x$), and lanthanum oxide ($La_2O_3$).

The deposition process for the deposition of a molybdenum film is that the deposition process is capable of forming thin films which are continuous over a large substrate area. One or more embodiments provide a process in which the deposition process is optimized to produce low electrical resistivity molybdenum films.

Figure 2A:
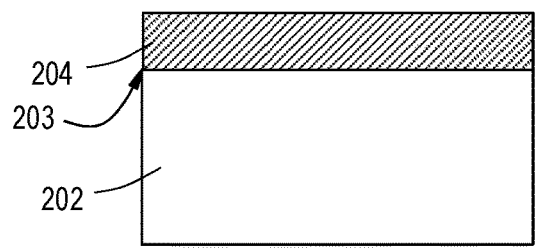
FIG. 2A illustrates a schematic cross-sectional view of dielectric layer on a substrate according to one or more embodiments.
Figure 2B:
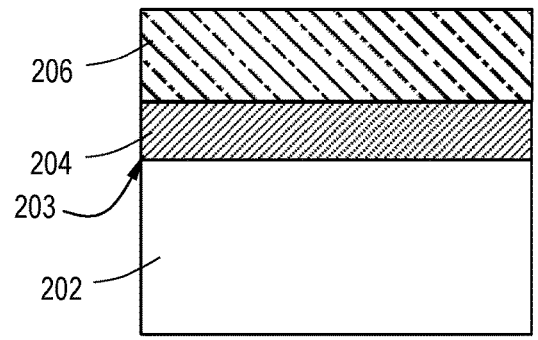
FIG. 2B illustrates a schematic cross-sectional view of an amorphous silicon layer on the dielectric layer on the substrate shown in FIG. 2A according to one or more embodiments.

FIGS. 2A-D depict cross sectional views of a deposition process on a substrate according to one or more embodiments which produces low electrical resistivity films on a dielectric layer. Referring first to FIG. 2A, a substrate 2A is shown, having a surface such as top surface 203 and a dielectric layer 204 on the top surface 203. Referring to FIG. 2B, in a one or more embodiments, a deposition method comprises forming an amorphous silicon layer 206 directly on the dielectric layer 204 on a top surface 203 of a substrate 202.

Figure 2C:
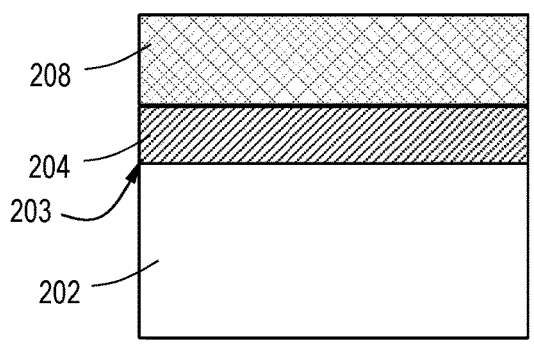
FIG. 2C illustrates a schematic cross-sectional view of the amorphous silicon layer on the substrate in FIG. 2B converted to a metal layer according to one or more embodiments.

Referring to FIG. 2C, the method according to one or more embodiments further comprises converting the amorphous silicon layer 206 to a metal layer 208 by thermally soaking the amorphous silicon layer 206 comprising silicon atoms in the presence of a metal compound selected from the group consisting of a molybdenum compound and a tungsten compound for a period of time until at least a portion of the silicon atoms in the amorphous silicon layer are replaced by metal atoms selected from the group consisting of molybdenum atoms and tungsten atoms to form the metal layer 208 having a thickness in a range of from 10 Angstroms to 50 Angstroms, or any of the thicknesses described herein.

Figure 2D:
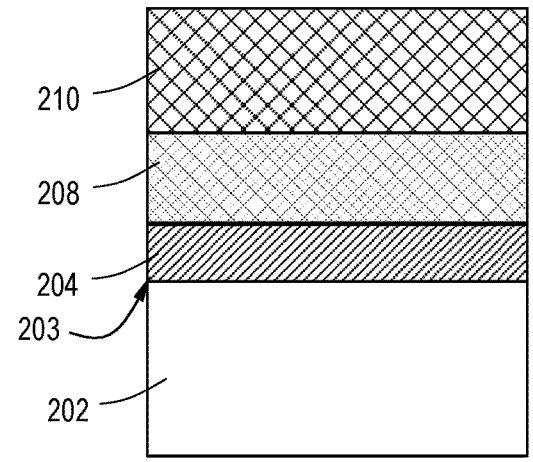
FIG. 2D illustrates a schematic cross-sectional view of a metal film on the metal layer in FIG. 2C according to one or more embodiments.

The method further comprises conformally depositing a molybdenum film 210 on the metal layer 208, to obtain the device shown in FIG. 2D.

In one or more embodiments, the metal layer 208 is formed by thermally soaking the amorphous silicon in a single step that is not repeated. In other words, the thermal soaking process is a continuous process that is performed for period of time to achieve a predetermined thickness.

In some embodiments, the dielectric layer 204 comprises silicon oxide ($SiO_x$), silicon nitride ($SiN_x$), silicon carbide (SiCx), silicon carbonitride (SiCxNy), silicon oxynitride (SiOxNy), a low-κ dielectric material, or combinations thereof. In some embodiments, forming the amorphous silicon layer 206 comprises exposing the surface of the substrate having the dielectric layer 204 to silane ($SiH_4$), disilane ($Si_2H_6$), or trisilane ($Si_3H_8$).

In embodiments in which the metal layer 208 comprises, consists essentially of or consists of tungsten, the tungsten compound is selected from the group consisting of tungsten hexafluoride (WF), tungsten hexachloride ($WCl_6$), tungsten (VI) oxytetrachloride ($WOCl_4$), and tungsten pentachloride ($WCl_5$). In embodiments in which the metal layer 208 comprises, consists essentially of or consist of tungsten metal the molybdenum compound is selected from the group consisting of molybdenum pentachloride ($MoCl_5$), molybdenum oxytetrachloride (MoOCl$_4$), molybdenum dichloride dioxide (MoO$_2$Cl$_2$), and molybdenum hexafluoride (MoF$_6$).

In one or more embodiments, thermally soaking the amorphous silicon layer is performed at a temperature in a range of 300° C. to 600° C., for example at a temperature in a range of from 300° C. to 550° C. or 300° C. to 500° C. and at a pressure in a range of from 10 Torr to 300 Torr, for example in a range of from 10 Torr to 250 Torr or 10 Torr to 200 Torr and the period of time is in a range of from 30 seconds to 600 seconds, for example 300 to 500 seconds, or 300 to 400 hundred seconds. The period of time is selected to obtain the predetermined or desired thickness of the metal layer 208. In some embodiments, the metal compounds during the thermal soaking are contained in ampoules or containers maintained at a temperature in a range of from 30° C. to 150° C.

In one or more embodiments, conformally depositing the molybdenum film 210 comprises one or more of atomic layer deposition (ALD), co-flowing a molybdenum precursor and hydrogen (H$_2$), or chemical vapor deposition (CVD).

Conformally depositing the molybdenum film comprises, according to some embodiments, utilizing one or more of atomic layer deposition (ALD), co-flowing a molybdenum precursor and hydrogen (H$_2$), or chemical vapor deposition (CVD). In some embodiments, the molybdenum precursor utilized during depositing the molybdenum film comprises one or more of molybdenum pentachloride (MoCl$_5$), molybdenum oxytetrachloride (MoOCl$_4$), molybdenum dichloride dioxide (MoO$_2$Cl$_2$), and molybdenum hexafluoride (MoF$_6$). In some embodiments, conformally depositing the molybdenum film is performed at a temperature in a range of 300° C. to 600° C. and at a pressure in a range of from 10 Torr to 300 Torr. The molybdenum precursor can be contained in ampoules or containers maintained at a temperature in a range of from 30° C. to 150° C.

Advantageously, the conformally deposited molybdenum film on the metal layer has a resistivity that is reduced by at least 30% compared to a titanium nitride (TiN) film having a conformally deposited molybdenum film deposited thereon. Experiments indicated such an improvement for films having a thickness in a range of from 100 microns to 120 microns.

Another aspect of the disclosure pertains to a method that is part of a gap fill process. Thus, a molybdenum metal film is deposited on a dielectric surface with one or more high aspect ratio gap features, including vertical gap features and/or horizontal gap features.

Referring to FIGS. 3A-3E, a method of filling a feature 300 formed on a top surface 303 of a substrate 302 is shown with respect to a feature 300 that is gap including opposed sidewalls 320 and a bottom surface 330. The substrate 302 can comprise any of the non-limiting materials described above with respect to FIGS. 2A-D. In the embodiments shown the substrate 302 is a dielectric region.

Figure 3A:
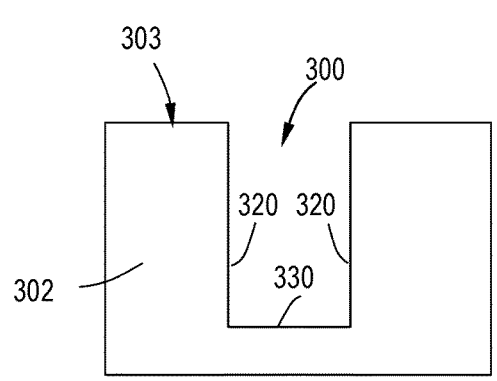
FIG. 3A illustrates a schematic cross-sectional view of a feature on a substrate according to one or more embodiments.
Figure 3B:
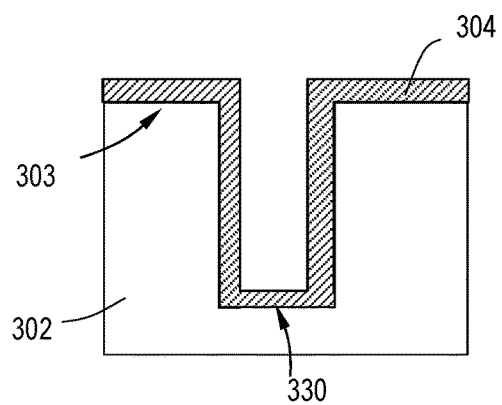
FIG. 3B illustrates a schematic cross-sectional view of an amorphous silicon layer on the feature on a substrate according to one or more embodiments.

In one of more embodiments, referring to FIG. 3B, a method of filing the feature 300 comprises forming an amorphous silicon layer 304 directly on a dielectric region including a top surface 303 within the feature 300 on the surface of the substrate 302, the feature 300 comprising at least one surface defining a via, the via comprising a bottom surface 330 and two opposed sidewalls 320 comprising the dielectric.

Figure 3C:
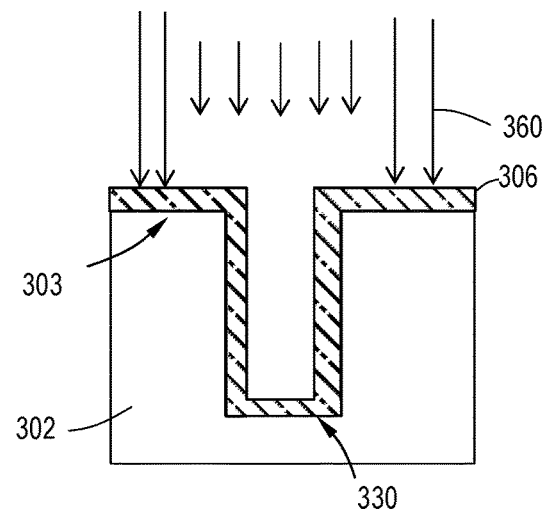
FIG. 3C illustrates a schematic cross-sectional view showing conversion of the amorphous silicon layer shown in FIG. 3B to a metal layer according to one or more embodiments.
Figure 3D:
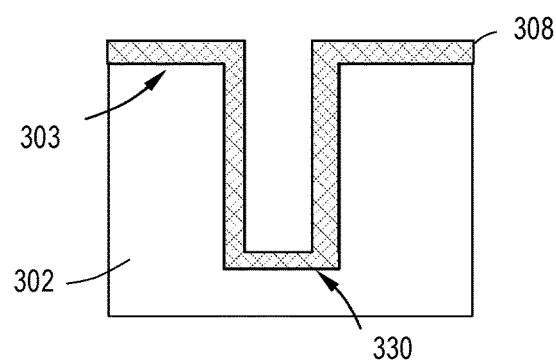
FIG. 3D illustrates a schematic cross-sectional view of the metal layer on the feature on a substrate after the amorphous silicon has been converted to a metal according to one or more embodiments.

Referring to FIG. 3C, the method further comprises converting the amorphous silicon layer 304 shown in FIG. 3B to a metal layer 306 by thermally soaking the amorphous silicon layer comprising silicon atoms in the presence of a metal compound selected from the group consisting of a molybdenum compound and a tungsten compound until at least a portion of the silicon atoms in the amorphous silicon layer are replaced by metal atoms selected from the group consisting of molybdenum atoms and tungsten atoms FIG. 3D shows the metal layer 308, after full conversion.

In one or more embodiments, thermally soaking the amorphous silicon layer is performed at a temperature in a range of 300° C. to 600° C., for example at a temperature in a range of from 300° C. to 550° C. or 300° C. to 500° C. and at a pressure in a range of from 10 Torr to 300 Torr, for example in a range of from 10 Torr to 250 Torr or 10 Torr to 200 Torr. The period of time of thermally soaking is selected to fill the feature 300. In some embodiments, the metal compounds during the thermal soaking are contained in ampoules or containers maintained at a temperature in a range of from 30° C. to 150° C.

Figure 3E:
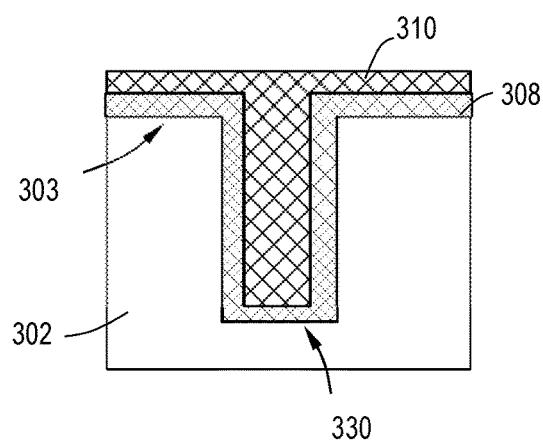
FIG. 3E illustrates a schematic cross-sectional view of the feature on a substrate including the metal layer shown in FIG. 3D and a metal film on the metal layer according to one or more embodiments.

Referring to FIG. 3E, the method comprises conformally depositing a molybdenum film 310 on the metal layer 308 to fill the feature 300, the conformally deposited molybdenum film 310 substantially free of seams or voids.

According to embodiments, thermally soaking comprises exposing the amorphous silicon layer to one or more of tungsten hexafluoride (WF$_6$), tungsten hexachloride (WCl$_6$), tungsten (VI) oxytetrachloride (WOCl$_4$), tungsten pentachloride (WCl$_6$), when the molybdenum film 310 comprises, consists of consists essentially of tungsten. In embodiments in which the molybdenum film 310 comprises, consists of or consists essentially of molybdenum, the precursor is selected from molybdenum pentachloride (MoCl$_5$), molybdenum oxytetrachloride (MoOCl$_4$), molybdenum dichloride dioxide (MoO$_2$Cl$_2$), and molybdenum hexafluoride (MoF$_6$).

Conformally depositing the molybdenum film comprises one or more of atomic layer deposition (ALD), co-flowing a molybdenum precursor and hydrogen (H$_2$), or chemical vapor deposition (CVD). The molybdenum precursor in the conformal film deposition of one or more embodiments comprises one or more of molybdenum pentachloride (MoCl$_5$), molybdenum oxytetrachloride (MoOCl$_4$), molybdenum dichloride dioxide (MoO$_2$Cl$_2$), and molybdenum hexafluoride (MoF$_6$).

Advantageously, a conformally deposited molybdenum film 310 on the metal layer 308 has a resistivity that is reduced by at least 30% compared to a titanium nitride (TiN) film having a molybdenum film deposited thereon. In embodiments, the molybdenum film is conformally deposited entirely within the vial.

In some embodiments, conformally depositing the molybdenum film is performed at a temperature in a range of 300° C. to 600° C. and at a pressure in a range of from 10 Torr to 300 Torr. The molybdenum precursor can be contained in ampoules or containers maintained at a temperature in a range of from 30° C. to 150° C.

The Figures show a substrate 302 having a single feature 300 for illustrative purposes; however, those skilled in the art will understand that there can be more than one feature 300. The shape of the feature 300 can be any suitable shape including, but not limited to, trenches and cylindrical vias. As used in this regard, the term "feature" means any intentional surface irregularity. Suitable examples of features include, but are not limited to, trenches and vias which have a top, two sidewalls and a bottom, and peaks which have a top and two sidewalls. In one or more embodiments, the at least one feature 300 comprises one or more of a trench or a via. In specific embodiments, the at least one feature 300 comprises a via. In still further embodiments, the term "at least one feature 300" and "via 300" may be used interchangeably. The via 300 has a depth to the bottom surface 330 and a width between the two opposed sidewalls 320, 320. In some embodiments, the depth is in a range of 2 nm to 200 nm, 3 nm to 200 nm, 5 nm to 100 nm, 2 nm to 100 nm, or 50 nm to 100 nm. In some embodiments, the width is in a range of 10 nm to 100 nm, 10 nm to 20 nm, 10 nm to 50 nm, or 50 nm to 100 nm. In some embodiments, the via 300 has an aspect ratio (depth/width) in a range of 1:1 to 20:1, 5:1 to 20:1, 10:1 to 20:1, or 15:1 to 20:1.

In some embodiments, the processes of deposition method 100 are each performed within the same processing chamber. In some embodiments, the processes of deposition method 100 are each performed within a different processing chamber. In some embodiments, the different processing chambers are connected as part of a processing system. In some embodiments, the processes of deposition method 100 are performed without an intervening vacuum break.

In some embodiments, one or more of the plurality of chemical exposures is performed in situ without breaking vacuum. In some embodiments, one or more of the plurality of chemical exposures is performed ex situ. As used herein, the term "in situ" refers to processes of deposition method 100 that are each performed in the same processing chamber or a different processing chamber that is connected as part of a processing system, such that each of the processes of deposition method 100 are performed without an intervening vacuum break. As used herein, the term "ex situ" refers to processes of deposition method 100 that are each performed in the same processing chamber or a different processing chamber such that one or more of the processes of deposition method 100 are performed with an intervening vacuum break.

In some embodiments, the molybdenum film 310 is laterally bounded by the two opposed sidewalls 320 of the at least one feature 300. As used in this regard, "laterally bounded" means that the deposited material does not extend beyond the point of intersection between the top surface and the two opposed sidewalls 320. In some embodiments, the molybdenum film 310 extends above the at least one feature 300. In some embodiments, the molybdenum film 310 fills the via 300. As used in this regard, a film which "fills the via" has a volume which occupies at least 95%, at least 98%, or at least 99% of the volume of the via 300. In some embodiments, the film which fills the via has a fill height in a range of from 30 nm to 75 nm, including in a range of from 40 nm to 60 nm.

Embodiments of the disclosure advantageously provide molybdenum films 310 having reduced resistivity compared to molybdenum films deposited by processes other than those described herein (e.g., deposition method 100). Embodiments of the disclosure advantageously provides molybdenum films 310 that are free or substantially free of voids and seams. As used in this regard, "substantially free" means that less than about 5%, including less than about 4%, less than about 3%, less than about 2%, less than about 1%, less than about 0.5%, and less than about 0.1% of the total composition of the in situ selectively deposited molybdenum film 430, on an atomic basis, comprises voids and/or seams.

Without intending to be bound by theory, it is thought that the continuous thermal soak process without repeating the process improves the quality of the deposited molybdenum film 310. In some embodiments, the molybdenum film 310 deposited by the methods described herein demonstrates reduced resistivity compared to molybdenum films made by other processes.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A deposition method comprising:
   forming an amorphous silicon layer directly on a dielectric layer on a surface of a feature including two sidewalls on a substrate;
   converting the amorphous silicon layer to a metal layer by continuously thermally soaking the amorphous silicon layer comprising silicon atoms in the presence of a metal compound for a period of time in a range of from 30 seconds 600 seconds without repeating the continuously thermally soaking the amorphous silicon layer, the metal compound selected from the group consisting of a molybdenum compound and a tungsten compound until at least a portion of the silicon atoms in the amorphous silicon layer are replaced by metal atoms selected from the group consisting of molybdenum atoms and tungsten atoms; and
   conformally depositing a molybdenum film on the metal layer.

2. The deposition method of claim 1, wherein the dielectric comprises silicon oxide, silicon nitride, silicon carbide, silicon carbonitride, silicon oxynitride, a low-κ dielectric material, or combinations thereof.

3. The deposition method of claim 1, wherein forming the amorphous silicon layer comprises exposing the surface of the substrate to silane ($SiH_4$), disilane ($Si_2H_6$), or trisilane ($Si_3H_8$).

4. The deposition method of claim 3, wherein forming the amorphous silicon layer is performed at a temperature in a range of 300° C. to 600° C. and at a pressure in a range of from 10 Torr to 300 Torr.

5. The deposition method of claim 1, wherein the tungsten compound is selected from the group consisting of tungsten hexafluoride ($WF_6$), tungsten hexachloride ($WCl_6$), tungsten (VI) oxytetrachloride ($WOCl_4$), tungsten pentachloride ($WCl_5$), and the molybdenum compound is selected from the group consisting of molybdenum pentachloride ($MoCl_5$), molybdenum oxytetrachloride ($MoOCl_4$), molybdenum dichloride dioxide ($MoO_2Cl_2$), and molybdenum hexafluoride ($MoF_6$).

6. The deposition method of claim 5, wherein the continuously thermally soaking the amorphous silicon layer is performed at a temperature in a range of 300° C. to 600° C. and at a pressure in a range of from 10 Torr to 300 Torr and the feature has a width in a range of 2 nm to 100 nm and an aspect ratio of depth/width in a range of 15:2 to 20:1 and less 0.5% of the molybdenum film on an atomic basis comprises voids and/or seams.

7. The deposition method of claim 1, wherein conformally depositing the molybdenum film comprises one or more of atomic layer deposition (ALD), co-flowing a molybdenum precursor and hydrogen ($H_2$), or chemical vapor deposition (CVD).

8. The deposition method of claim 7, wherein the molybdenum precursor comprises one or more of molybdenum pentachloride ($MoCl_5$), molybdenum oxytetrachloride ($MoOCl_4$), molybdenum dichloride dioxide ($MoO_2Cl_2$), and molybdenum hexafluoride ($MoF_6$).

9. The deposition method of claim 7, wherein conformally depositing the molybdenum film is performed at a temperature in a range of 300° C. to 600° C. and at a pressure in a range of from 10 Torr to 300 Torr.

10. The deposition method of claim 1, wherein the conformally deposited molybdenum film on the metal layer has a resistivity that is reduced by at least 30% compared to a titanium nitride (TiN) film having a conformally deposited molybdenum film deposited thereon.

11. The deposition method of claim 1, wherein the period of time is in range of from 300 seconds to 600 seconds.

12. The deposition method of claim 11, wherein the metal compound during the continuously thermal soaking is contained in an ampoule maintained at a temperature in a range of from 30° C. to 150° C.

13. A method of filling a feature formed on a surface of a substrate, the method comprising:
  forming an amorphous silicon layer directly on a dielectric region within the feature on the surface of the substrate, the feature comprising at least one surface defining a via, the via comprising a bottom surface and two sidewalls defining a width in a range 2 nm to 100 nm and an aspect ratio of depth/width in a range of 15 to 20:1 and comprising the dielectric;
  converting the amorphous silicon layer to a metal layer by continuously thermally soaking the amorphous silicon layer comprising silicon atoms in the presence of a metal compound for a period of time in a range of from 30 seconds 600 seconds without repeating the continuously thermally soaking the amorphous silicon layer, the metal compound selected from the group consisting of a molybdenum compound and a tungsten compound until at least a portion of the silicon atoms in the amorphous silicon layer are replaced by metal atoms selected from the group consisting of molybdenum atoms and tungsten atoms; and
  conformally depositing a molybdenum film on the metal layer to fill the feature, the conformally deposited molybdenum film substantially free of seams or voids so that less than 0.5% of the molybdenum film on an atomic basis comprises voids and/or seams.

14. The method of claim 13, wherein the thermal soak comprises exposing the amorphous silicon layer to one or more of tungsten hexafluoride ($WF_6$), tungsten hexachloride ($WCl_6$), tungsten (VI) oxytetrachloride ($WOCl_4$), tungsten pentachloride ($WCl_5$), molybdenum pentachloride ($MoCl_5$), molybdenum oxytetrachloride ($MoOCl_4$), molybdenum dichloride dioxide ($MoO_2Cl_2$), and molybdenum hexafluoride ($MoF_6$).

15. The method of claim 13, wherein conformally depositing the molybdenum film comprises one or more of atomic layer deposition (ALD), co-flowing a molybdenum precursor and hydrogen ($H_2$), or chemical vapor deposition (CVD).

16. The method of claim 15, wherein the molybdenum precursor comprises one or more of molybdenum pentachloride ($MoCl_5$), molybdenum oxytetrachloride ($MoOCl_4$), molybdenum dichloride dioxide ($MoO_2Cl_2$), and molybdenum hexafluoride ($MoF_6$).

17. The method of claim 13, wherein the conformally deposited molybdenum film on the metal layer has a resistivity that is reduced by at least 30% compared to a titanium nitride (TiN) film having a molybdenum film deposited thereon.

18. The method of claim 13, wherein the molybdenum film is conformally deposited entirely within the via and the metal compound during the continuously thermal soaking is contained in an ampoule maintained at a temperature in a range of from 30° C. to 150° C.

19. The method of claim 13, wherein converting the amorphous silicon layer to a metal layer comprises thermally soaking the amorphous silicon layer comprising silicon atoms in the presence the tungsten compound to form a tungsten layer having a thickness in a range of from 10 Angstroms to 50 Angstroms and the period of lime is in range of from 300 seconds to 600 seconds.

20. The method of claim 13, wherein converting the amorphous silicon layer to a metal layer comprises thermally soaking the amorphous silicon layer comprising silicon atoms in the presence the molybdenum compound to form a molybdenum layer having a thickness in a range of from 10 Angstroms to 50 Angstroms and the period of time is in range of from 300 seconds to 600 seconds.

* * * * *